United States Patent

Noda et al.

(10) Patent No.: US 8,916,948 B2
(45) Date of Patent: *Dec. 23, 2014

(54) PYROELECTRIC DETECTOR, PYROELECTRIC DETECTION DEVICE, AND ELECTRONIC INSTRUMENT

(75) Inventors: Takafumi Noda, Nagano (JP); Jun Takizawa, Nagano (JP)

(73) Assignee: Seiko Epson Corporation, Tokyo (JP)

(*) Notice: Subject to any disclaimer, the term of this patent is extended or adjusted under 35 U.S.C. 154(b) by 214 days.

This patent is subject to a terminal disclaimer.

(21) Appl. No.: 13/565,922

(22) Filed: Aug. 3, 2012

(65) Prior Publication Data

US 2012/0292511 A1 Nov. 22, 2012

Related U.S. Application Data

(63) Continuation of application No. 13/069,749, filed on Mar. 23, 2011, now Pat. No. 8,258,597.

(30) Foreign Application Priority Data

Mar. 26, 2010 (JP) ................. 2010-072079

(51) Int. Cl.
*H01L 29/66* (2006.01)
*G01J 5/34* (2006.01)
*G01J 5/02* (2006.01)
*H01L 37/02* (2006.01)

(52) U.S. Cl.
CPC .... *G01J 5/34* (2013.01); *G01J 5/02* (2013.01); *G01J 5/024* (2013.01); *H01L 37/02* (2013.01)
USPC ............ 257/467; 257/414; 257/E29.347

(58) Field of Classification Search
USPC ................... 257/467, 414, E29.347
See application file for complete search history.

(56) References Cited

U.S. PATENT DOCUMENTS

| | | | |
|---|---|---|---|
| 6,441,374 B1 | 8/2002 | Kawano et al. | |
| 7,812,385 B2 | 10/2010 | Noda | |
| 7,825,027 B2 | 11/2010 | Noda et al. | |
| 8,258,597 B2 * | 9/2012 | Noda et al. ............ | 257/467 |
| 2005/0280059 A1 | 12/2005 | Takano | |
| 2007/0134817 A1 | 6/2007 | Noda | |
| 2007/0187735 A1 | 8/2007 | Takano | |
| 2008/0019075 A1 | 1/2008 | Sawasaki et al. | |
| 2008/0303074 A1 | 12/2008 | Noda | |
| 2009/0068763 A1 | 3/2009 | Noda | |
| 2009/0072287 A1 | 3/2009 | Noda | |
| 2009/0127604 A1 | 5/2009 | Noda | |

FOREIGN PATENT DOCUMENTS

| | | |
|---|---|---|
| JP | 09-061238 A | 3/1997 |
| JP | 09-126884 A | 5/1997 |
| JP | 2001-099705 A | 4/2001 |
| JP | 2001-237464 A | 8/2001 |

(Continued)

*Primary Examiner* — Long Pham
(74) *Attorney, Agent, or Firm* — Global IP Counselors, LLP

(57) ABSTRACT

A pyroelectric detector includes a support member, a capacitor and a fixing part. The support member includes a first side and a second side opposite from the first side, with the first side facing a cavity. The capacitor includes a pyroelectric body between a first electrode and a second electrode such that an amount of polarization varies based on a temperature. The capacitor is mounted and supported on the second side of the support member with the first electrode being disposed on the second side of the support member. The fixing part supports the support member, with the cavity being formed between the support member and the fixing part.

20 Claims, 7 Drawing Sheets

(56) References Cited

FOREIGN PATENT DOCUMENTS

| | | |
|---|---|---|
| JP | 2002-214038 A | 7/2002 |
| JP | 2006-005234 A | 1/2006 |
| JP | 2007-150025 A | 6/2007 |
| JP | 2008-028114 A | 2/2008 |
| JP | 2008-218782 A | 9/2008 |
| JP | 2008-232896 A | 10/2008 |
| JP | 2009-065089 A | 3/2009 |
| JP | 2009-071022 A | 4/2009 |
| JP | 2009-071241 A | 4/2009 |
| JP | 2009-071242 A | 4/2009 |
| JP | 2009-124017 A | 6/2009 |
| JP | 2009-129972 A | 6/2009 |
| JP | 2009-130188 A | 6/2009 |
| JP | 2009-141179 A | 6/2009 |

* cited by examiner

PYROELECTRIC DETECTOR, PYROELECTRIC DETECTION DEVICE, AND ELECTRONIC INSTRUMENT

CROSS-REFERENCE TO RELATED APPLICATIONS

This is a continuation application of U.S. patent application Ser. No. 13/069,749 filed on Mar. 23, 2011. This application claims priority to Japanese Patent Application No. 2010-072079 filed on Mar. 26, 2010. The entire disclosures of U.S. patent application Ser. No. 13/069,749 and Japanese Patent Application No. 2010-072079 are hereby incorporated herein by reference.

BACKGROUND

1. Technical Field

The present invention relates to a pyroelectric detector, a pyroelectric detection device, and an electronic instrument or the like.

2. Related Art

Known thermo-optical detection devices include pyroelectric or bolometer-type infrared detection devices. An infrared detection device utilizes a change (pyroelectric effect or pyroelectronic effect) in the amount of spontaneous polarization of a pyroelectric material according to the light intensity (temperature) of received infrared rays to create an electromotive force (charge due to polarization) at both ends of the pyroelectric body (pyroelectric-type) or vary a resistance value according to the temperature (bolometer-type) and detect the infrared rays. Compared with a bolometer-type infrared detection device, a pyroelectric infrared detection device is complex to manufacture, but has the advantage of excellent detection sensitivity.

A cell of a pyroelectric infrared detection device has a capacitor which includes a pyroelectric body connected to an upper electrode and a lower electrode, and various proposals have been made regarding the material of the electrodes or the pyroelectric body (Japanese Laid-Open Patent Publication No. 2008-232896).

A capacitor which includes a ferroelectric body connected to an upper electrode and a lower electrode is used in ferroelectric memory, and various proposals have been made regarding the material of the electrodes or the ferroelectric body to be suitable for ferroelectric memory (Japanese Laid-Open Patent Publication No. 2009-71242 and Japanese Laid-Open Patent Publication No. 2009-129972).

SUMMARY

A pyroelectric infrared detection device utilizes the effect (pyroelectric effect) whereby the amount of spontaneous polarization of the pyroelectric material varies according to temperature, and therefore differs significantly from ferroelectric memory in having a structure in which heat does not readily escape from the capacitor.

An object of the several aspects of the present invention is to provide a pyroelectric detector having a structure in which heat of a capacitor having a pyroelectric body does not readily escape via a support member for supporting the capacitor, and to provide a pyroelectric detection device and an electronic instrument.

A pyroelectric detector according to one aspect of the present invention includes a support member, a capacitor and a fixing part. The support member includes a first side and a second side opposite from the first side, with the first side facing a cavity. The capacitor includes a pyroelectric body between a first electrode and a second electrode such that an amount of polarization varies based on a temperature. The capacitor is mounted and supported on the second side of the support member with the first electrode being disposed on the second side of the support member. The fixing part supports the support member, with the cavity being formed between the support member and the fixing part.

Through this configuration, the heat caused by infrared rays is readily transmitted to the pyroelectric body via the first electrode, the heat of the pyroelectric body does not readily escape to the support member via the second electrode, and the signal sensitivity of the pyroelectric detector is enhanced. The first electrode positioned further toward the support member than the second electrode may be mounted directly on the first side of the support member, or may be mounted via another layer.

In the pyroelectric detector as described above, the first electrode preferably has a greater thickness than the second electrode.

The thermal conductance G1 of the first electrode is expressed as $G1=\lambda 1/T1$ ($\lambda 1$: thermal conductivity; T1: thickness), and the thermal conductance G2 of the second electrode is expressed as $G2=\lambda 2/T2$ ($\lambda 2$: thermal conductivity; T2: thickness). When the thermal conductivity of the first and second electrodes is such that $\lambda 1=\lambda 2$, and the thickness T1 of the first electrode is greater than the thickness T2 of the second electrode (T1>T2), a thermal conductance relationship whereby G1<G2 can be satisfied.

In the pyroelectric detector as described above, the first electrode, the second electrode, and the pyroelectric body are preferably preferentially-oriented in a prescribed crystal plane. The first electrode preferably has a seed layer for preferentially-orienting the pyroelectric body in the prescribed crystal plane. The second electrode preferably has an orientation alignment layer in a position contacting the pyroelectric body with crystal orientation of the orientation alignment layer being aligned with crystal orientation of the pyroelectric body. The seed layer preferably has a greater thickness than the orientation alignment layer.

The seed layer and the orientation alignment layer are sometimes formed from the same material or the same type of material, for example, for the sake of the orientation functions thereof. When the seed layer is formed having a greater thickness than the orientation alignment layer, the thermal conductance of the seed layer in the first electrode is easily made less than the thermal conductance of the orientation alignment layer in the second electrode, and the relationship G1<G2 is easily obtained.

In the pyroelectric detector as described above, the first electrode further preferably includes an orientation control layer for preferentially-orienting the seed layer in the prescribed crystal plane, the orientation control layer being disposed between the support member and the seed layer.

Through this configuration, the presence of the orientation control layer enables the seed layer to have the same preferred orientation direction as the orientation control layer, and the characteristics of the seed layer are enhanced. There are also at least two layers of first electrode with respect to at least one layer of second electrode, and the relationship G1<G2 is easily obtained.

In the pyroelectric detector as described above, the first electrode preferably further includes a first reducing gas barrier layer having barrier properties with respect to a reducing gas, the first reducing gas barrier layer being disposed between the seed layer and the orientation control layer.

The characteristics of the pyroelectric body of the capacitor are degraded when oxygen deficit occurs due to reducing gas. Reductive obstructive factors from the side of the support member can be blocked by the first reducing gas barrier layer in the first electrode positioned on the support member side in the capacitor. The first reducing gas barrier layer may also have the same preferred orientation direction as the orientation control layer. There are also at least three layers of first electrode with respect to at least one layer of second electrode, and the relationship G1<G2 is easily obtained.

In the pyroelectric detector as described above, the first electrode preferably further includes an adhesive layer between the orientation control layer and the support member.

Since the orientation control properties of the orientation control layer degrade when there are surface irregularities or voids against the base layer, an adhesive layer is provided to maintain the orientation control properties. There are also at least four layers of first electrode with respect to at least one layer of second electrode, and the relationship G1<G2 is easily obtained. The adhesive layer is a layer having high adhesion to the support member in comparison with the orientation control layer.

In the pyroelectric detector as described above, the second electrode preferably further includes a second reducing gas barrier layer having barrier properties with respect to a reducing gas, with the orientation alignment layer being disposed between the second reducing gas barrier layer and the pyroelectric body.

Through this configuration, reductive obstructive factors from above the capacitor can be blocked by the second reducing gas barrier layer in the second electrode. The second reducing gas barrier layer may have the same preferred orientation direction as the orientation alignment layer.

In the pyroelectric detector as described above, the second electrode preferably further includes a low-resistance layer, with the second reducing gas barrier layer being disposed between the low-resistance layer and the orientation control layer. The orientation control layer and the low-resistance layer are preferably made of the same material, and the orientation control layer has a greater thickness than the low-resistance layer.

Through this configuration, it is possible to overcome the problem of increased contact resistance when the second reducing gas barrier layer is connected to a wiring plug, and an orientation control layer having a greater thickness than the low-resistance layer is added to the second electrode. The relationship G1<G2 is therefore easily obtained. The low-resistance layer is a layer having low contact resistance to the wiring plug connected to the second electrode, in comparison with the second reducing gas barrier layer. The low-resistance layer may also have the same preferred orientation direction as the second reducing gas barrier layer.

In the pyroelectric detector as described above, the first reducing gas barrier layer and the second reducing gas barrier layer are preferably made of the same material, and the first reducing gas barrier layer has a greater thickness than the second reducing gas barrier layer.

Through this configuration, since the first electrode has a greater thickness than the second electrode in terms of total layer thickness, the relationship G1<G2 is easily obtained.

In the pyroelectric detector as described above, the first reducing gas barrier layer and the second reducing gas barrier layer are preferably made of the same material, and the second reducing gas barrier layer has a greater thickness than the first reducing gas barrier layer.

By thus increasing the thickness of the second reducing gas barrier layer to enhance the barrier properties thereof, a particular enhancement is gained in the effects whereby reductive obstructive factors from the wiring plug can be blocked. Through this configuration, the thermal conductance of the first electrode increases in comparison with the first and second reducing gas barrier layers, but by adjusting the layer thickness or the properties (thermal conductivity) of the other materials, the relationship G1<G2 can easily be obtained.

In the pyroelectric detector as described above, the prescribed crystal plane is preferably a (111) plane. The (100) plane or another plane may be preferred over the (111) plane as the crystal plane in order to increase the pyroelectric coefficient, but by making the crystal plane the (111) plane, the polarity with respect to the applied field direction is easily controlled.

The pyroelectric detector as described above preferably further includes a light-absorbing member configured to transmit heat obtained by absorption of light to the capacitor, the light-absorbing member being disposed on an upstream side of the capacitor with respect to an incidence path of light incident to the second electrode of the capacitor. The second electrode is preferably configured to reflect the light passed through the light-absorbing member to the light-absorbing member.

Through this configuration, unnecessarily transmitted light can be returned to the light-absorbing member so as to contribute to heat evolution. The position of a reflecting plate (second electrode) can be set so that multiple reflection occurs at a distance of $\lambda/4$, where $\lambda$ is the detection wavelength. The function of the reflecting plate is taken on by the metal closest to the light-absorbing member in the second electrode.

A pyroelectric detection device according to another aspect of the present invention includes a plurality of the pyroelectric detectors according to claim 1 arranged in two dimensions along two axes. In this pyroelectric detection device, the detection sensitivity is increased in the pyroelectric detector of each cell, and a distinct light (temperature) distribution image can therefore be provided.

An electronic instrument according to another aspect of the present invention has the pyroelectric detector or pyroelectric detection device described above, and by using one or a plurality of cells of the pyroelectric detector as a sensor, the electronic instrument is most suitable in thermography for outputting a light (temperature) distribution image, in automobile navigation and surveillance cameras as well as object analysis instruments (measurement instruments) for analyzing (measuring) physical information of objects, in security instruments for detecting fire or heat, in FA (Factory Automation) instruments provided in factories or the like, and in other applications.

BRIEF DESCRIPTION OF THE DRAWINGS

Referring now to the attached drawings which form a part of this original disclosure.

DETAILED DESCRIPTION OF EXEMPLARY EMBODIMENTS

Preferred embodiments of the present invention will be described in detail. The embodiments described below do not unduly limit the scope of the present invention as recited in the claims, and all of the configurations described in the embodiments are not necessarily essential means of achievement of the present invention.

1. Pyroelectric Infrared Detection Device

Figure 1:
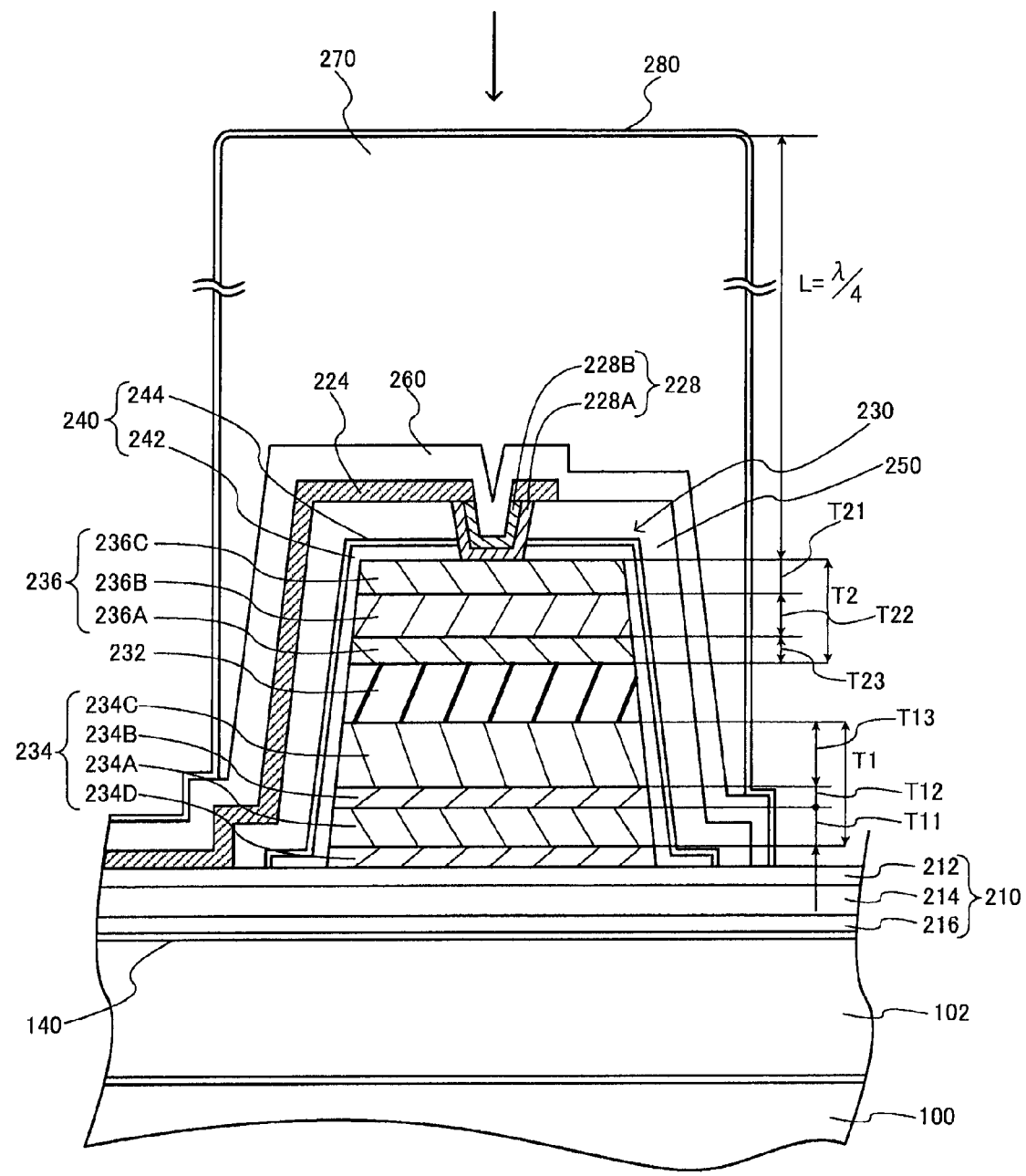
FIG. 1 is a simplified sectional view showing the structure of the capacitor of the pyroelectric infrared detector according to an embodiment of the present invention.
Figure 2:
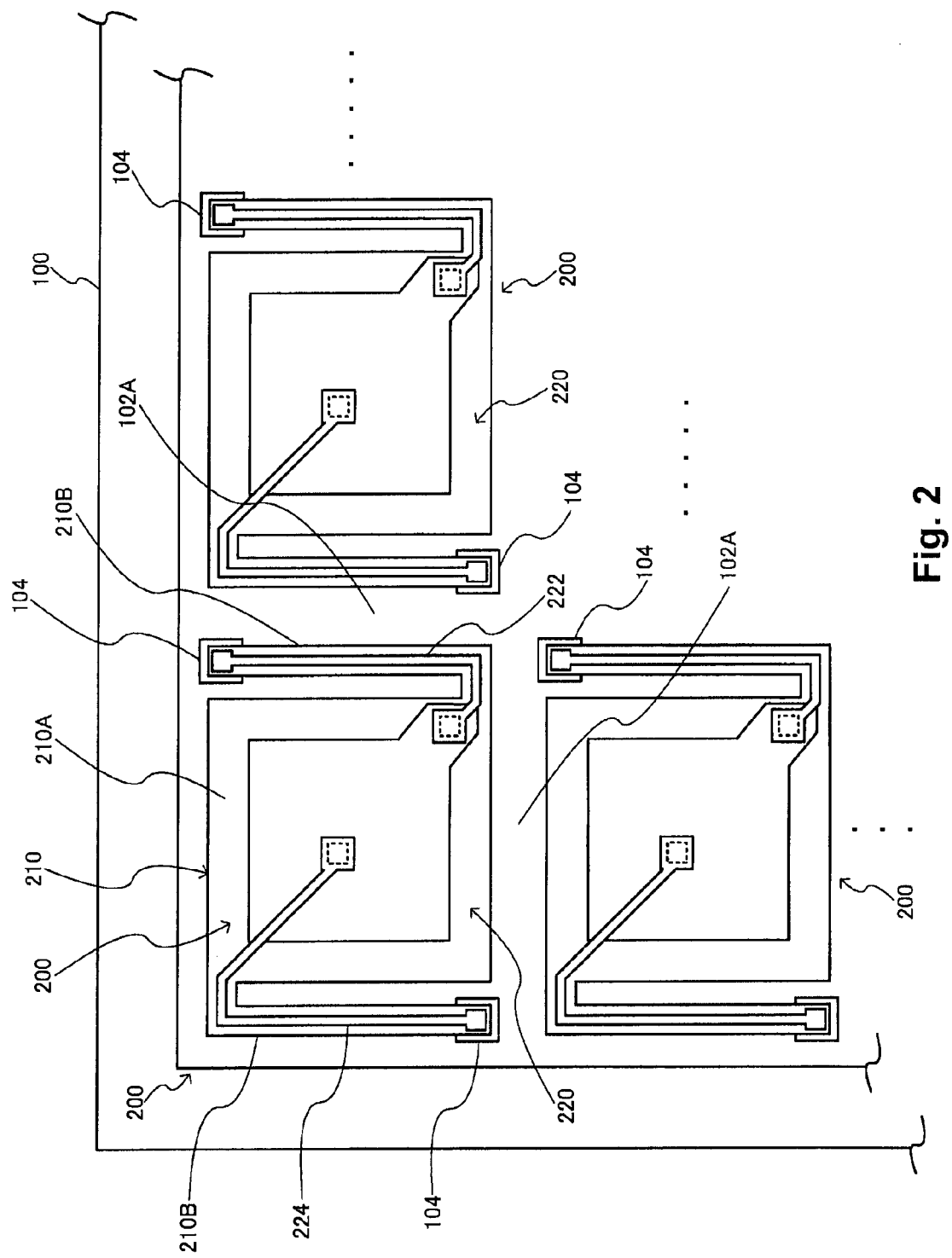
FIG. 2 is a simplified plan view showing the pyroelectric infrared detection device according to an embodiment of the present invention.

FIG. 2 shows a pyroelectric infrared detection device (one example of a pyroelectric detection device) in which a plurality of cells of pyroelectric infrared detectors (one example of pyroelectric detectors) is arranged along two orthogonal axes, each cell being provided with the capacitor structure (described hereinafter) shown in FIG. 1. A pyroelectric infrared detection device may also be formed by a pyroelectric infrared detector of a single cell. In FIG. 2, a plurality of posts 104 is provided upright from a base part (also referred to as a fixing part) 100, and pyroelectric infrared detectors 200, each cell of which is supported by two posts 104, for example, are arranged along two orthogonal axes. The area occupied by each cell of pyroelectric infrared detectors 200 is 30×30 μm, for example.

As shown in FIG. 2, each pyroelectric infrared detector 200 includes a support member (membrane) 210 linked to two posts 104, and an infrared detection element (one example of a pyroelectric detection element) 220. The area occupied by the pyroelectric infrared detection element 220 of one cell is 10×10 μm, for example.

Besides being connected to the two posts 104, the pyroelectric infrared detector 200 of each cell is in a non-contacting state, a cavity 102 (see FIG. 3) is formed below the pyroelectric infrared detector 200, and open parts 102A communicated with the cavity 102 are provided on the periphery of the pyroelectric infrared detector 200 in plan view. The pyroelectric infrared detector 200 of each cell is thereby thermally separated from the base part 100 as well as from the pyroelectric infrared detectors 200 of other cells.

The support member 210 has a mounting part 210A for mounting and supporting the pyroelectric infrared detection element 220, and two arms 210B linked to the post 104. The two arms 210B are formed so as to extend redundantly and with a narrow width in order to thermally separate the pyroelectric infrared detection element 220.

FIG. 2 is a plan view which omits the members above the wiring layers connected to the upper electrodes, and FIG. 2 shows a first electrode (lower electrode) wiring layer 222 and a second electrode (upper electrode) wiring layer 224 connected to the pyroelectric infrared detection element 220. The first and second electrode wiring layers 222, 224 extend along the arms 210B, and are connected to a circuit inside the base part 100 via the posts 104. The first and second electrode wiring layers 222, 224 are also formed so as to extend redundantly and with a narrow width in order to thermally separate the pyroelectric infrared detection element 220.

2. Overview of the Pyroelectric Infrared Detector

Figure 3:
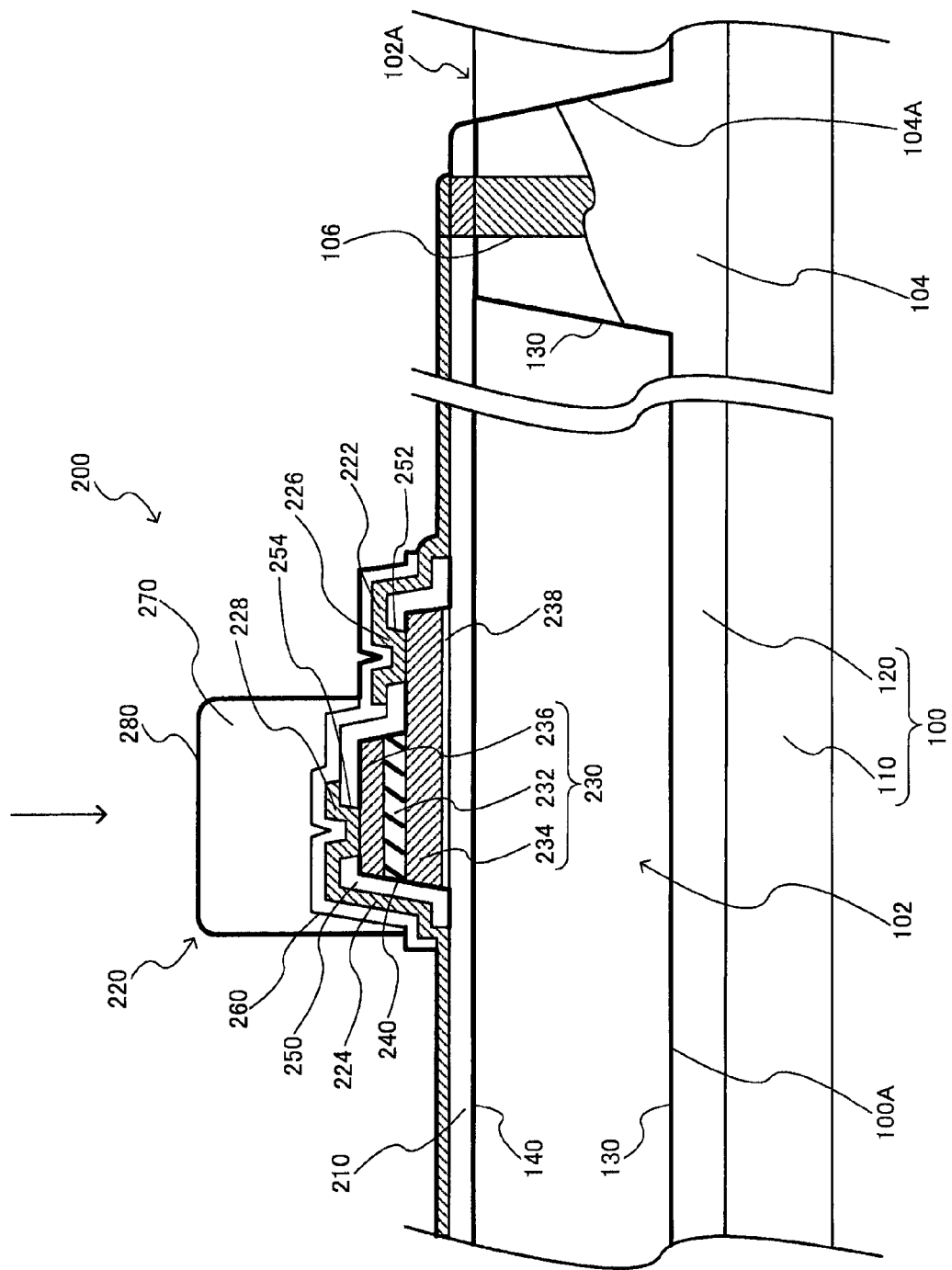
FIG. 3 is a simplified sectional view showing the pyroelectric detector of one cell of the pyroelectric infrared detection device shown in FIG. 2.
Figure 4:
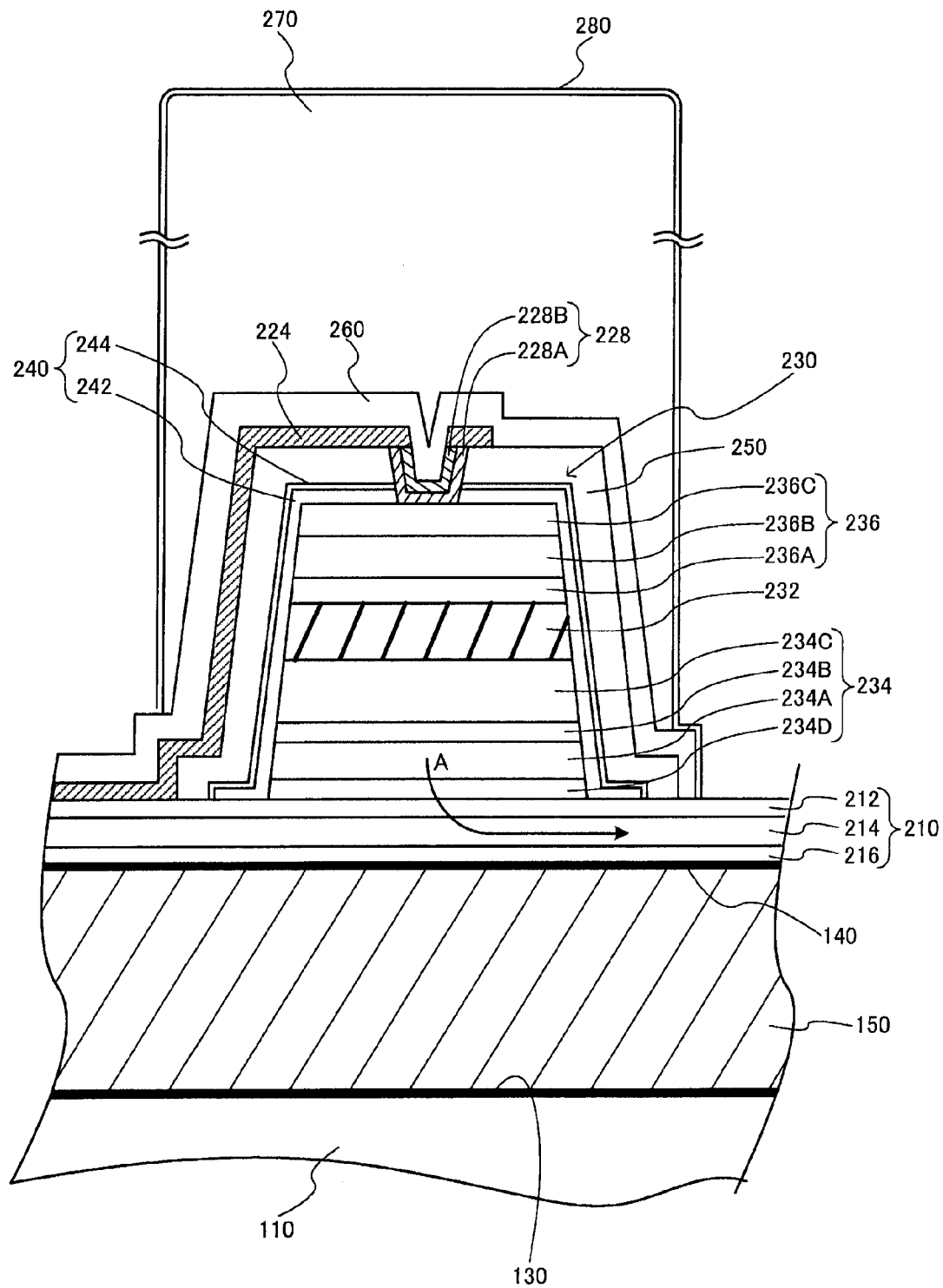
FIG. 4 is a simplified sectional view showing a manufacturing step, and shows the support member and infrared detection element formed on the sacrificial layer.

FIG. 3 is a sectional view showing the pyroelectric infrared detector 200 shown in FIG. 2. FIG. 4 is a partial sectional view showing the pyroelectric infrared detector 200 during the manufacturing process. In FIG. 4, the cavity 102 is embedded by a sacrificial layer 150. The sacrificial layer 150 is present from before the step of forming the support member 210 and the pyroelectric infrared detection element 220 until after this formation step, and is removed by isotropic etching after the step of forming the pyroelectric infrared detection element 220.

As shown in FIG. 3, the base part 100 includes a substrate, e.g., a silicon substrate 110, and a spacer layer 120 formed by an interlayer insulation layer on the silicon substrate 110. The post 104 is formed by etching the spacer layer 120. A plug 106 connected to one of the first and second electrode wiring layers 222, 224 may be disposed at the post 104. The plug 106 is connected to a row selection circuit (row driver) provided to the silicon substrate 110, or a read circuit for reading data from an optical detector via a column line. The cavity 102 is formed at the same time as the post 104 by etching the spacer layer 120. The open parts 102A shown in FIG. 2 are formed by pattern etching the support member 210.

The pyroelectric infrared detection element 220 mounted on the support member 210 includes a capacitor 230. The capacitor 230 includes a pyroelectric body 232, a first electrode (lower electrode) 234 connected to the lower surface of the pyroelectric body 232, and a second electrode (upper electrode) 236 connected to the upper surface of the pyroelectric body 232. The first electrode 234 may include an adhesive layer 234D for increasing adhesion to a first layer member (e.g., $SiO_2$) of the support member 210.

The capacitor 230 is covered by a reducing gas barrier layer 240 for suppressing penetration of reducing gas (hydrogen, water vapor, OH groups, methyl groups, and the like) into the capacitor 230 during steps after formation of the capacitor 230. The reason for this is that the pyroelectric body (e.g., PZT or the like) 232 of the capacitor 230 is an oxide, and when an oxide is reduced, oxygen deficit occurs and the pyroelectric effects are compromised.

The reducing gas barrier layer 240 includes a first barrier layer 242 and a second barrier layer 244, as shown in FIG. 4. The first barrier layer 242 can be formed by forming a layer of aluminum oxide $Al_2O_3$, for example, by sputtering. Since reducing gas is not used in sputtering, no reduction of the capacitor 230 occurs. The second barrier layer 244 can be formed by forming a layer of aluminum oxide $Al_2O_3$, for example, by Atomic Layer Chemical Vapor Deposition (AL-CVD), for example. Common CVD (Chemical Vapor Deposition) methods use reducing gas, but the capacitor 230 is isolated from the reducing gas by the first barrier layer 242.

The total layer thickness of the reducing gas barrier layer 240 herein is 50 to 70 nm, e.g., 60 nm. At this time, the layer thickness of the first barrier layer 242 formed by CVD is greater than that of the second barrier layer 244 formed by Atomic Layer Chemical Vapor Deposition (ALCVD), and is 35 to 65 nm, e.g., 40 nm, at minimum. In contrast, the layer thickness of the second barrier layer 244 formed by Atomic Layer Chemical Vapor Deposition (ALCVD) can be reduced; for example, a layer of aluminum oxide $Al_2O_3$ is formed having a thickness of 5 to 30 nm, e.g., 20 nm. Atomic Layer Chemical Vapor Deposition (ALCVD) has excellent embedding characteristics in comparison with sputtering and other methods, and can therefore be adapted for miniaturization, and the reducing gas barrier properties in the first and second barrier layers 242, 244 can be enhanced. The first barrier layer 242 formed by sputtering is not fine in comparison with the second barrier layer 244, but this aspect contributes to lowering the heat transfer rate thereof, and dissipation of heat from the capacitor 230 can therefore be prevented.

An interlayer insulation layer 250 is formed on the reducing gas barrier layer 240. Hydrogen gas, water vapor, or other reducing gas usually is formed when the starting material gas (TEOS) of the interlayer insulation layer 250 chemically reacts. The reducing gas barrier layer 240 provided on the periphery of the capacitor 230 protects the capacitor 230 from the reducing gas that occurs during formation of the interlayer insulation layer 250.

The first electrode (lower electrode) wiring layer 222 and second electrode (upper electrode) wiring layer 224 shown in FIG. 2 as well are disposed on the interlayer insulation layer 250. A first contact hole 252 and second contact hole 254 are formed in advance in the interlayer insulation layer 250 before formation of the electrode wiring. At this time, a contact hole is formed in the same manner in the reducing gas barrier layer 240 as well. The first electrode (lower electrode) 234 and the first electrode wiring layer 222 are made continuous by a first plug 226 embedded in the first contact hole 252. The second electrode (upper electrode) 236 and the second electrode wiring layer 224 are made continuous in the same manner by a second plug 228 embedded in the second contact hole 254.

When the interlayer insulation layer 250 is not present in this arrangement, during pattern etching of the first electrode (lower electrode) wiring layer 222 and the second electrode (upper electrode) wiring layer 224, the second barrier layer 244 of the reducing gas barrier layer 240 beneath is etched, and the barrier properties thereof are reduced. The interlayer insulation layer 250 may be necessary in order to secure the barrier properties of the reducing gas barrier layer 240.

The interlayer insulation layer 250 preferably has a low hydrogen content. The interlayer insulation layer 250 is therefore degassed by annealing. The hydrogen content of the interlayer insulation layer 250 is thereby made lower than that of a passivation layer 260 for covering the first and second electrode wiring layers 222, 224.

Figure 5:
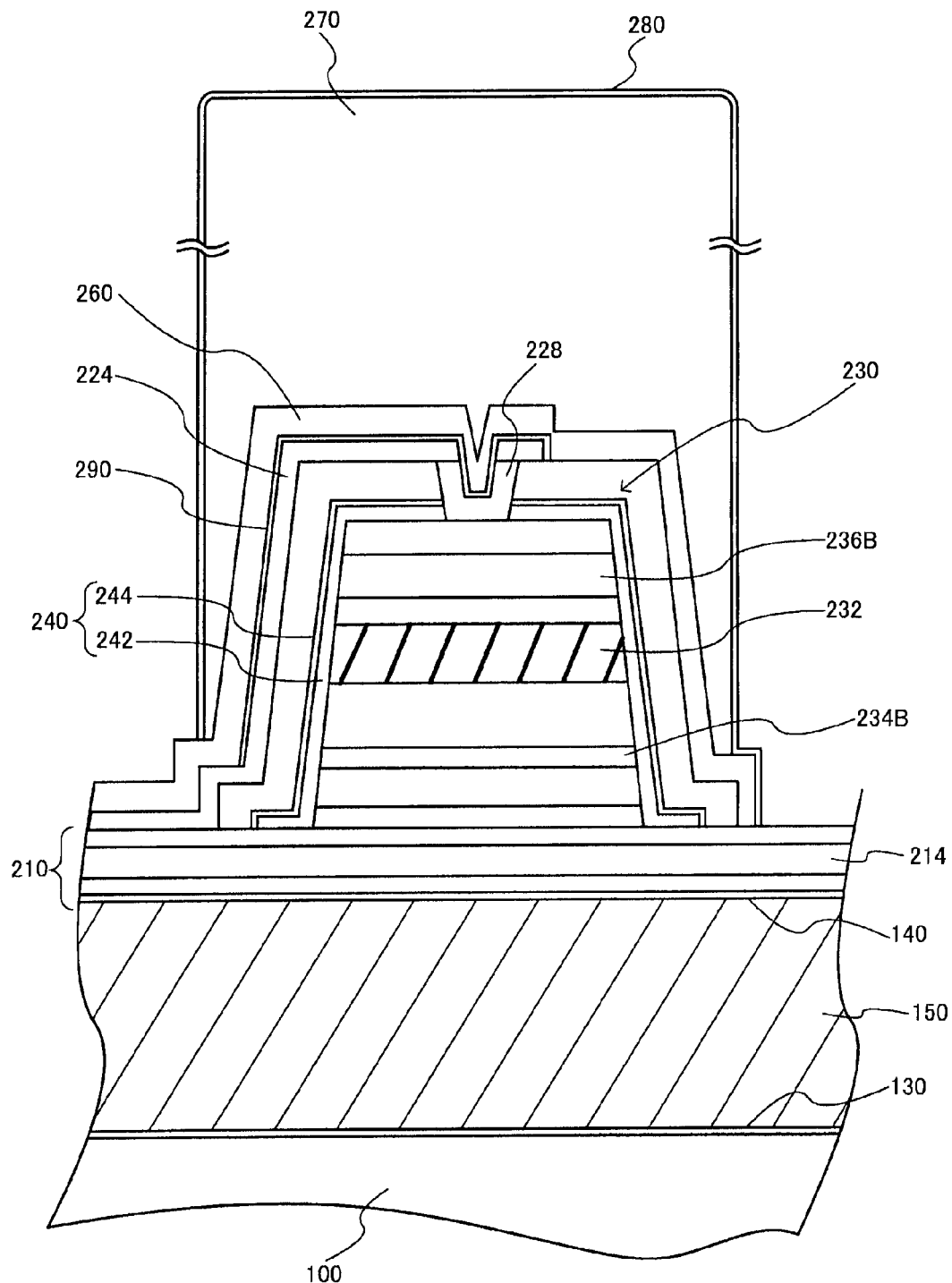
FIG. 5 is a simplified sectional view showing a modification in which the reducing gas barrier properties in the vicinity of the wiring plug are enhanced.

Since the reducing gas barrier layer 240 at the top of the capacitor 230 is devoid of contact holes and closed when the interlayer insulation layer 250 is formed, the reducing gas during formation of the interlayer insulation layer 250 does not penetrate into the capacitor 230. However, the barrier properties decline after the contact hole is formed in the reducing gas barrier layer 240. As an example of a technique for preventing this phenomenon, the first and second plugs 226, 228 are formed by a plurality of layers 228A, 228B (only the second plug 228 is shown in FIG. 4), as shown in FIG. 4, and a barrier metal layer is used in the first layer 228A. Reducing gas barrier properties are ensured by the barrier metal of the first layer 228A. Highly diffusible metals such as titanium Ti are not preferred as the barrier metal of the first layer 228A, and titanium aluminum nitride TiAlN, which has minimal diffusibility and high reducing gas barrier properties, can be used. A reducing gas barrier layer 290 may be additionally provided so as to surround at least the second plug 228 as shown in FIG. 5, as a method for stopping the penetration of reducing gas from the contact hole. This reducing gas barrier layer 290 may also serve as the barrier metal 228A of the second plug 228, or the barrier metal 228A may be removed. The reducing gas barrier layer 290 may also coat the first plug 226.

The $SiO_2$ or SiN passivation layer 260 is provided so as to cover the first and second electrode wiring layers 222, 224. An infrared-absorbing body (one example of a light-absorbing member) 270 is provided on the passivation layer 260 above at least the capacitor 230. The passivation layer 260 is also formed from $SiO_2$ or SiN, but is preferably formed from a different type of material which has a high etching selection ratio with respect to the passivation layer 260 below, due to the need for pattern etching of the infrared-absorbing body 270. Infrared rays are incident on the infrared-absorbing body 270 from the direction of the arrow in FIG. 2, and the infrared-absorbing body 270 evolves heat in accordance with the amount of infrared rays absorbed. This heat is transmitted to the pyroelectric body 232, whereby the amount of spontaneous polarization of the capacitor 230 varies according to the heat, and the infrared rays can be detected by detecting the charge due to the spontaneous polarization. The infrared-absorbing body 270 is not limited to being provided separately from the capacitor 230, and need not be provided separately in a case in which the infrared-absorbing body 270 is present within the capacitor 230.

Even when reducing gas is generated during CVD formation of the passivation layer 260 or the infrared-absorbing body 270, the capacitor 230 is protected by the reducing gas barrier layer 240 and the barrier metals in the first and second plugs 226, 228.

A reducing gas barrier layer 280 is provided so as to cover the external surface of the pyroelectric infrared detector 200 which includes the infrared-absorbing body 270. The reducing gas barrier layer 280 must be formed with a smaller thickness than the reducing gas barrier layer 240, for example, in order to increase the transmittance of infrared rays (in the wavelength spectrum of 8 to 14 μm) incident on the infrared-absorbing body 270. For this purpose, Atomic Layer Chemical Vapor Deposition (ALCVD) is used, which is capable of adjusting the layer thickness at a level corresponding to the size of an atom. The reason for this is that the layer formed by a common CVD method is too thick, and infrared transmittance is adversely affected. In the present embodiment, a layer is formed having a thickness of 10 to 50 nm, e.g., 20 nm, from aluminum oxide $Al_2O_3$, for example. As described above, Atomic Layer Chemical Vapor Deposition (ALCVD) has excellent embedding characteristics in comparison with sputtering and other methods, and is therefore adapted to miniaturization, a precise layer can be formed at the atomic level, and reducing gas barrier properties can be increased even in a thin layer.

On the side of the base part 100, an etching stop layer 130 for use during isotropic etching of the sacrificial layer 150 (see FIG. 4) embedded in the cavity 102 in the process of manufacturing the pyroelectric infrared detector 200 is formed on a wall part for defining the cavity 102, i.e., a side wall 104A and a bottom wall 100A for defining the cavity. An etching stop layer 140 is formed in the same manner on a lower surface (upper surface of the sacrificial layer 150) of the support member 210. In the present embodiment, the reducing gas barrier layer 280 is formed from the same material as the etching stop layers 130, 140. In other words, the etching stop layers 130, 140 also have reducing gas barrier properties. The etching stop layers 130, 140 are also formed by forming layers of aluminum oxide $Al_2O_3$ at a thickness of 20 to 50 nm by Atomic Layer Chemical Vapor Deposition (ALCVD).

Since the etching stop layer 140 has reducing gas barrier properties, when the sacrificial layer 150 is isotropically etched by hydrofluoric acid in a reductive atmosphere, it is possible to keep the reducing gas from passing through the support member 210 and penetrating into the capacitor 230. Since the etching stop layer 130 for covering the base part 100 has reducing gas barrier properties, it is possible to keep the transistors or wiring of the circuit in the base part 100 from being reduced and degraded.

3. Structure of the Capacitor

3.1 Thermal Conductance

FIG. 1 is a simplified sectional view showing the structure of the capacitor 230 of the present embodiment in further detail. As described above, the capacitor 230 includes a pyroelectric body 232 between the first electrode (lower electrode) 234 and the second electrode (upper electrode) 236. The capacitor 230 is mounted and supported on a second surface or second side (upper surface or upper side in FIG. 1) which faces a first surface or first side (lower surface or upper side in FIG. 1) at which the support member 210 faces the cavity 102. Infrared rays can be detected by utilizing a change (pyroelectric effect or pyroelectronic effect) in the amount of spontaneous polarization of the pyroelectric body 232 according to the light intensity (temperature) of the incident infrared rays. In the present embodiment, the incident infrared rays are absorbed by the infrared-absorbing body 270, heat is evolved by the infrared-absorbing body 270, and the heat evolved by the infrared-absorbing body 270 is transmitted via a solid heat transfer path between the infrared-absorbing body 270 and the pyroelectric body 232.

In the capacitor 230 of the present embodiment, the thermal conductance C1 of the first electrode (lower electrode) 234 adjacent to the support member 210 is less than the thermal conductance C2 of the second electrode (upper electrode) 236. Through this configuration, the heat caused by the infrared rays is readily transmitted to the pyroelectric body 232 via the second electrode (upper electrode) 236, the heat of the pyroelectric body 232 does not readily escape to the support member 210 via the first electrode (lower electrode) 234, and the signal sensitivity of the infrared detection element 220 is enhanced.

In the support member 210 of the present embodiment on which the capacitor 230 is mounted, since residual stress causes curvature to occur when a single layer is used as shown in FIGS. 1 and 4, the support member 210 is formed by a plurality of layers, e.g., three layers, so that the stress that causes curvature is cancelled out by the residual stresses of both tension and compression.

In order from the capacitor 230 side, a first layer member 212 is composed of an oxide layer (e.g., $SiO_2$), a second layer member 214 is composed of a nitride layer (e.g., $Si_3N_4$), and a third layer member 216 is composed of an oxide layer (e.g., $SiO_2$, the same as the first layer member 212). Since the oxide layers and the nitride layer are stressed in opposite directions, the stress which causes curvature in the support member can be cancelled out. Since a nitride layer (e.g., $Si_3N_4$) has reducing gas barrier properties, the second layer member 214 of the support member 210 also functions to block reductive obstructive factors from penetrating from the side of the support member 210 to the pyroelectric body 232 of the capacitor 230.

The structure of the capacitor 230 having the characteristics described above will be described in further detail with reference to FIG. 1. First, the thickness T1 of the first electrode (lower electrode) 234 is greater than that of the second electrode (upper electrode) 236 (T1>T2). The thermal conductance G1 of the first electrode (lower electrode) 234 is such that $G1=\lambda 1/T1$, where $\lambda 1$ is the thermal conductivity of the first electrode (lower electrode) 234. The thermal conductance G2 of the second electrode (upper electrode) 236 is such that $G2=\lambda 2/T2$, where $\lambda 2$ is the thermal conductance of the second electrode (upper electrode) 236.

In order to obtain a thermal conductance relationship of C1<C2, when the first and second electrodes 234, 236 are both formed from the same single material, such as platinum Pt or iridium Ir, then $\lambda 1=\lambda 2$, and T1>T2 from FIG. 1. The relationship G1<G2 can therefore be satisfied.

A case in which the first and second electrodes 234, 236 are each formed from the same material will first be considered. In the capacitor 230, in order for the crystal direction of the pyroelectric body 232 to be aligned, it is necessary to align the crystal lattice level of the boundary of the lower layer on which the pyroelectric body 232 is formed with the first electrode 234. In other words, although the first electrode 234 has the function of a crystal seed layer, platinum Pt has strong self-orienting properties and is therefore preferred as the first electrode 234. Iridium Ir is also suitable as a seed layer material.

In the second electrode (upper electrode) 236, the crystal orientations are preferably continuously related from the first electrode 234 through the pyroelectric body 232 and the second electrode 236, without breaking down the crystal properties of the pyroelectric body 232. The second electrode 236 is therefore preferably formed from the same material as the first electrode 234.

When the second electrode 236 is thus formed by the same material, e.g., Pt, Ir, or another metal, as the first electrode 234, the upper surface of the second electrode 236 can be used as a reflective surface. In this case, as shown in FIG. 1, the distance L from the top surface of the infrared-absorbing body 270 to the top surface of the second electrode 236 is preferably $\lambda/4$ (where $\lambda$ is the detection wavelength of infrared rays). Through this configuration, multiple reflection of infrared rays of the detection wavelength $\lambda$ occurs between the top surface of the infrared-absorbing body 270 and the top surface of the second electrode 236, and infrared rays of the detection wavelength $\lambda$ can therefore be efficiently absorbed by the infrared-absorbing body 270.

3.2 Electrode Multilayer Structure

The structure of the capacitor 230 of the present embodiment shown in FIG. 1 will next be described. In the capacitor 230 shown in FIG. 1, the preferred orientation directions of the pyroelectric body 232, the first electrode 234, and the second electrode 236 are aligned with the (111) orientation, for example. Through a preferred orientation in the (111) plane direction, the orientation rate of (111) orientation with respect to other plane directions is controlled to 90% or higher, for example. The (100) orientation or other orientation is more preferred than the (111) orientation in order to increase the pyroelectric coefficient, but the (111) orientation is used so as to make polarization easy to control with respect to the applied field direction. However, the preferred orientation direction is not limited to this configuration.

The first electrode 234 may include, in order from the support member 210, an orientation control layer (e.g., Ir) 234A for controlling the orientation so as to give the first electrode 234 a preferred orientation in the (111) plane, for example, a first reducing gas barrier layer (e.g., IrOx) 234B, and a preferentially-oriented seed layer (e.g., Pt) 234C.

The second electrode 236 may include, in order from the pyroelectric body 232, an orientation alignment layer (e.g., Pt) 236A in which the crystal alignment is aligned with the pyroelectric body 232, a second reducing gas barrier layer (e.g., IrOx) 236B, and a low-resistance layer (e.g., Ir) 236C for lowering the resistance of the bonded surface with the second plug 228 connected to the second electrode 236.

The first and second electrodes 234, 236 of the capacitor 230 are provided with a multilayer structure in the present embodiment so that the pyroelectric infrared detection element 220 is processed with minimal damage and without reducing the capability thereof despite the small heat capacity thereof, the crystal lattice levels are aligned at each boundary, and the pyroelectric body (oxide) 232 is isolated from reducing gas even when the periphery of the capacitor 230 is exposed to a reductive atmosphere during manufacturing or use.

The pyroelectric body 232 is formed by growing a crystal of PZT (lead zirconate titanate: generic name for Pb(Zr, Ti)O$_3$), PZTN (generic name for the substance obtained by adding Nb to PZT), or the like with a preferred orientation in the (111) plane direction, for example. The use of PZTN is preferred, because even a thin layer is not readily reduced, and oxygen deficit can be suppressed. In order to obtain directional crystallization of the pyroelectric body 232, directional crystallization is performed from the stage of forming the first electrode 234 as the layer under the pyroelectric body 232.

The Ir layer 234A for functioning as an orientation control layer is therefore formed on the lower electrode 234 by sputtering. A titanium aluminum nitride (TiAlN) layer or a titanium nitride (TiN) layer, for example, as the adhesive layer 234D may also be formed under the orientation control layer 234A, as shown in FIG. 1. The reason for this is that adhesion may be difficult to maintain, depending on the material of the support member 210. When the first layer member 212 of the support member 210 positioned beneath the adhesive layer 234D is formed from SiO$_2$, the first layer member 212 is preferably formed by an amorphous material or a material having smaller grains than polysilicon. The smoothness of the surface of the support member 210 on which the capacitor 230 is mounted can thereby be maintained. When the surface on which the orientation control layer 234A is formed is rough, the irregularities of the rough surface are reflected in the growth of the crystal, and a rough surface is therefore not preferred.

In order to isolate the pyroelectric body 232 from reductive obstructive factors from below the capacitor 230, the IrOx layer 234B for functioning as a reducing gas barrier layer in the first electrode 234 is used together with the second layer member (e.g., Si$_3$N$_4$) 214 of the support member 210, and the etching stop layer (e.g., Al$_2$O$_3$) 140 of the support member 210, which exhibit reducing gas barrier properties. The reducing gas used in degassing from the base part 100 during baking or other annealing steps of the pyroelectric body (ceramic) 232, or in the isotropic etching step of the sacrificial layer 150, for example, is a reductive obstructive factor.

Evaporation vapor sometimes formed inside the capacitor 230 in the baking step of the pyroelectric body 232 and during other high-temperature processing, but an escape route for this vapor is maintained by the first layer member 212 of the support member 210, as indicated by the arrow in FIG. 4. In other words, in order to allow evaporation vapor formed inside the capacitor 230 to escape, it is better to provide gas barrier properties to the second layer member 214 than to provide gas barrier properties to the first layer member 212.

The IrOx layer 234B as such has minimal crystallinity, but the IrOx layer 234B is in a metal-metal oxide relationship with the Ir layer 234A and thus has good compatibility therewith, and can therefore have the same preferred orientation direction as the Ir layer 234A.

The Pt layer 234C for functioning as a seed layer in the first electrode 234 is a seed layer for the preferred orientation of the pyroelectric body 232, and has the (111) orientation. In the present embodiment, the Pt layer 234C has a two-layer structure. The first Pt layer forms the basis of the (111) orientation, microroughness is formed on the surface by the second Pt layer, and the Pt layer 234C thereby functions as a seed layer for preferred orientation of the pyroelectric body 232. The pyroelectric body 232 is in the (111) orientation after the fashion of the seed layer 234C.

In the second electrode 236, since the boundaries of sputtered layers are physically rough, trap sites occur, and there is a risk of degraded characteristics, the lattice alignment is reconstructed on the crystal level so that the crystal orientations of the first electrode 234, the pyroelectric body 232, and the second electrode 236 are continuously related.

The Pt layer 236A in the second electrode 236 is formed by sputtering, but the crystal direction of the boundary immediately after sputtering is not continuous. Therefore, an annealing process is subsequently performed to re-crystallize the Pt layer 236A. In other words, the Pt layer 236A functions as an orientation alignment layer in which the crystal orientation is aligned with the pyroelectric body 232.

The IrOx layer 236B in the second electrode 236 functions as a barrier for factors which degrade the reducing properties from above the capacitor 230. Since the IrOx layer 236B has a high resistance value, the Ir layer 236C in the second electrode 236 is used to lower the resistance value with respect to the second plug 228. The Ir layer 236C is in a metal oxide-metal relationship with the IrOx layer 236B and thus has good compatibility therewith, and can therefore have the same preferred orientation direction as the IrOx layer 236B.

In the present embodiment, the first and second electrodes 234, 236 thus have multiple layers arranged in the sequence Pt, IrOx, Ir from the pyroelectric body 232, and the materials forming the first and second electrodes 234, 236 are arranged symmetrically about the pyroelectric body 232.

However, the thicknesses of each layer of the multilayer structures forming the first and second electrodes 234, 236 are asymmetrical about the pyroelectric body 232. The total thickness T1 of the first electrode 234 and the total thickness T2 of the second electrode 236 satisfy the relationship (T1>T2) as also described above. The thermal conductivities of the Ir layer 234A, IrOx layer 234B, and Pt layer 234C of the first electrode 234 are designated as $\lambda 1$, $\lambda 2$, and $\lambda 3$, respectively, and the thicknesses thereof are designated as T11, T12, and T13, respectively. The thermal conductivities of the Ir layer 236C, IrOx layer 236B, and Pt layer 236A of the second electrode 236 are also designated as $\lambda 1$, $\lambda 2$, and $\lambda 3$, respectively, and the thicknesses thereof are designated as T21, T22, and T23, respectively.

When the thermal conductances of the Ir layer 234A, IrOx layer 234B, and Pt layer 234C of the first electrode 234 are designated as G11, G12, and G13, respectively, G11=$\lambda$1/T11, G12=$\lambda$2/T12, and G13=$\lambda$3/T13. When the thermal conductances of the Ir layer 236C, IrOx layer 236B, and Pt layer 236A of the second electrode 236 are designated as G21, G22, and G23, respectively, G21=$\lambda$1/T21, G22=$\lambda$2/T22, and G23=$\lambda$3/T23.

Since 1/G1=(1/G11)+(1/G12)+(1/G13), the total thermal conductance G1 of the first electrode 234 is expressed by the equation (1) below.

$$G1=(G11 \times G12 \times G13)/(G11 \times G12+G12 \times G13+G11 \times G13) \quad (1)$$

In the same manner, since $1/G2=(1/G21)+(1/G22)+(1/G23)$, the total thermal conductance G2 of the second electrode 236 is expressed by the equation (2) below.

$$G2=(G21\times G22\times G23)/(G21\times G22+G22\times G23+G21\times G23) \quad (2)$$

The thicknesses of each layer of the multilayer structure s forming the first and second electrodes 234, 236 are substantially in the relationships described below under conditions that satisfy T11+T12+T13=T1>T2=T21+T22+T23.
Ir layers 234A, 236C T11:T21=1:0.7
IrOx layers 234B, 236B T12:T22=0.3:1
Pt layers 234C, 236A T13:T23=3:1

The reasons for adopting such layer thickness relationships are as follows. First, regarding the Ir layers 234A, 236C, since the Ir layer 234A in the first electrode 234 functions as an orientation control layer, a predetermined layer thickness is necessary in order to impart orientation properties, whereas the purpose of the Ir layer 236C of the second electrode 236 is to lower resistance, and lower resistance can be obtained the thinner the layer is.

Next, regarding the IrOx layers 234B, 236B, barrier properties against reductive obstructive factors from below and above the capacitor 230 are obtained by joint use of other barrier layers (the second layer member 214, the reducing gas barrier layer 240, and the etching stop layers/reducing gas barrier layers 140, 280), and the IrOx layer 234B of the first electrode 234 is formed having a small thickness, but the thickness of the IrOx layer 236B of the second electrode is increased to compensate for low barrier properties in the second plug 228.

Lastly, regarding the Pt layers 234C, 236A, the Pt layer 234C in the first electrode 234 functions as a seed layer for determining the preferred orientation of the pyroelectric body 232, and therefore must have a predetermined layer thickness, whereas the purpose of the Pt layer 236A of the second electrode 236 is to function as an orientation alignment layer aligned with the orientation of the pyroelectric body 232, and the Pt layer 236A may therefore be formed with a smaller thickness than the Pt layer 234C in the first electrode 234.

The thickness ratio of the Ir layer 234A, IrOx layer 234B, and Pt layer 234C of the first electrode 234 is set so that T11:T12:T13=10:3:15, for example, and the thickness ratio of the Ir layer 236C, IrOx layer 236B, and Pt layer 236A of the second electrode 236 is set so that T21:T22:T23=7:10:5, for example.

The thermal conductivity 23 of λ3 is equal to 71.6 (W/m•K), and the thermal conductivity λ1 of Ir is equal to 147 (W/m•K), which is substantially twice the thermal conductivity λ3 of Pt. The thermal conductivity λ2 of IrOx varies according to the temperature or the oxygen/metal ratio (O/M), but does not exceed the thermal conductivity λ1 of Ir. When the layer thickness relationships and thermal conductivity relationships described above are substituted into Equations (1) and (2) to calculate the size relationship between G1 and G2, it is apparent that G1<G2. Thus, even when the first and second electrodes 234, 236 are endowed with a multilayer structure as in the present embodiment, the expression G1<G2 is satisfied from the relationship of the thermal conductivities and layer thicknesses.

When the first electrode 234 has the adhesive layer 234D on the bonded surface with the support member 210 as described above, the thermal conductance G1 of the first electrode 234 is reduced, and the relationship G1<G2 is easily satisfied.

Since the etching mask of the capacitor 230 degrades as etching proceeds, the side walls of the capacitor 230 acquire a tapered shape which is narrower at the top and wider at the bottom as shown in FIG. 1, the more layers are added to the structure. However, since the taper angle with respect to the horizontal surface is about 80 degrees, considering that the total height of the capacitor 230 is on the order of nanometers, the increase in surface area of the first electrode 234 with respect to the second electrode 236 is small. The amount of heat transferred by the first electrode 234 can thereby be kept smaller than the amount of heat transferred by the second electrode 236, based on the relationship between the thermal conductance values of the first and second electrodes 234, 236.

3.3 Modifications of the Capacitor Structure

A single-layer structure and multilayer structure are described above for the first and second electrodes 234, 236 of the capacitor 230, but various other combinations of structures are possible which produce the thermal conductance relationship G1<G2 while maintaining the function of the capacitor 230.

First, the Ir layer 236C of the second electrode 236 may be omitted. The reason for this is that in this case, the object of lowering resistance is achieved in the same manner when Ir, for example, is used as the material of the second plug 228. Through this configuration, since the thermal conductance G2 of the second electrode 236 is greater than in the case shown in FIG. 1, the relationship G1<G2 is easily satisfied. A reflective surface for defining L=λ/4 shown in FIG. 1 takes the place of the Pt layer 236A of the second electrode 236 in this case, but a multiple reflection surface can be maintained in the same manner.

Next, the thickness of the IrOx layer 236B in the second electrode 236 in FIG. 1 may be made equal to or less than the thickness of the IrOx layer 234B in the first electrode 234. As described above, since the barrier properties against reductive obstructive factors from below and above the capacitor 230 are obtained by joint use of other barrier layers (the second layer member 214, the reducing gas barrier layer 240, and the etching stop layers/reducing gas barrier layers 140, 280), when the reducing gas barrier properties in the second plug 228 are increased by the configuration shown in FIG. 5, for example, there is no need for the thickness of the IrOx layer 236B in the second electrode 236 to be greater than the thickness of the IrOx layer 234B in the first electrode 234. Through this configuration, the thermal conductance G2 of the second electrode 236 further increases, and the relationship G1<G2 is easier to obtain.

Next, the IrOx layer 234B in the first electrode 234 may be omitted. Crystal continuity between the Ir layer 234A and the Pt layer 234C is not hindered by omission of the IrOx layer 234B, and no problems occur with regard to crystal orientation. When the IrOx layer 234B is omitted, the capacitor 230 has no barrier layer with respect to reductive obstructive factors from below the capacitor 230. However, the second layer member 214 is present in the support member 210 for supporting the capacitor 230, and the etching stop layer 140 is present on the lower surface of the support member 210, and when the second layer member 214 and the etching stop layer 140 are formed by layers having reducing gas barrier properties, barrier properties with respect to reductive obstructive factors from below the capacitor 230 can be maintained in the capacitor 230.

When the IrOx layer 234B in the first electrode 234 is omitted in this arrangement, the thermal conductance G1 of the first electrode 234 increases. It may therefore be necessary to increase the thermal conductance G2 of the second electrode 236 as well in order to obtain the relationship G1<G2. In this case, the IrOx layer 236B in the second electrode 236 may be omitted, for example. Once the IrOx layer 236B is omitted, the Ir layer 236C is also no longer necessary. The reason for this is that the Pt layer 236A functions as a low-resistance layer instead of the Ir layer 236C. Barrier properties with respect to reductive obstructive factors from above the capacitor 230 can be maintained by the reducing gas barrier layer 240 described above, the barrier metal 228A shown in FIG. 4, or the reducing gas barrier layer 290 shown in FIG. 5.

When the second electrode 236 shown in FIG. 1 is formed only by the Pt layer 236A as described above, the first electrode 234 may be formed by the Pt layer 234C as a single layer, by the Ir layer 234A and Pt layer 234C as two layers, or by the Ir layer 234A of FIG. 1, the IrOx layer 234B, and the Pt layer 234C as three layers. In any of these cases, the relationship G1<G2 can easily be obtained by making the thickness T11 of the Ir layer 234A of the first electrode 234 greater than the thickness T21 of the Pt layer 236A of the second electrode 236 (T11>T21), for example.

4. Electronic Instrument

Figure 6:
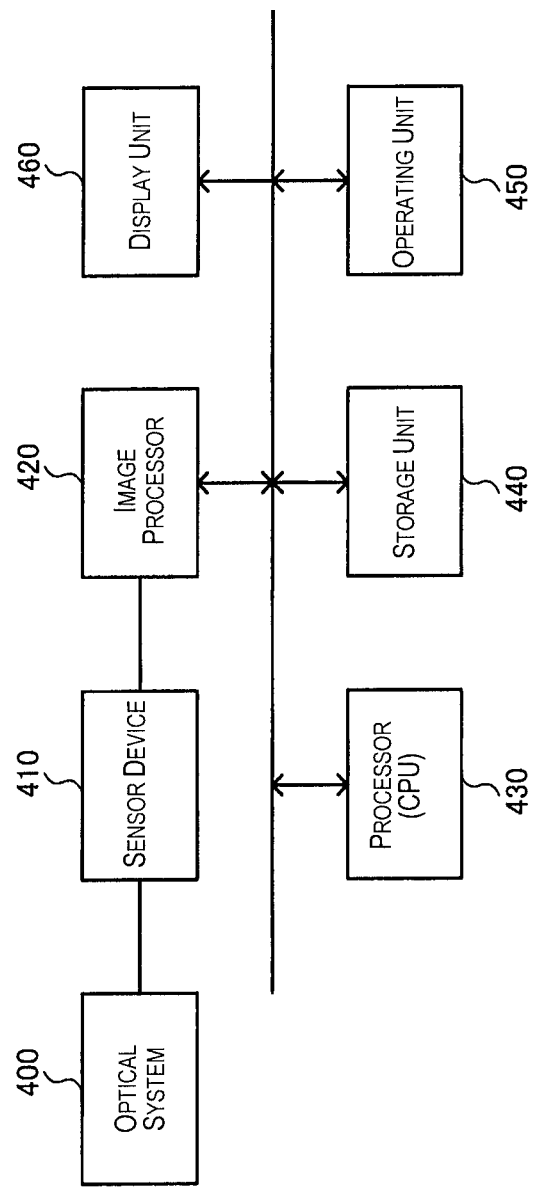
FIG. 6 is a block diagram showing the electronic instrument which includes the thermo-optical detector or thermo-optical detection device.

FIG. 6 shows an example of the configuration of an electronic instrument which includes the pyroelectric detector or pyroelectric detection device of the present embodiment. The electronic instrument includes an optical system 400, a sensor device (pyroelectric detection device) 410, an image processor 420, a processor 430, a storage unit 440, an operating unit 450, and a display unit 460. The electronic instrument of the present embodiment is not limited to the configuration shown in FIG. 6, and various modifications thereof are possible, such as omitting some constituent elements (e.g., the optical system, operating unit, display unit, or other components) or adding other constituent elements.

The optical system 400 includes one or more lenses, for example, a drive unit for driving the lenses, and other components. Such operations as forming an image of an object on the sensor device 410 are also performed. Focusing and other adjustments are also performed as needed.

The sensor device 410 is formed by arranging the pyroelectric detector 200 of the present embodiment described above in two dimensions, and a plurality of row lines (word lines, scan lines) and a plurality of column lines (data lines) are provided. In addition to the optical detector arranged in two dimensions, the sensor device 410 may also include a row selection circuit (row driver), a read circuit for reading data from the optical detector via the column lines, an A/D conversion unit, and other components. Image processing of an object image can be performed by sequentially reading data from optical detectors arranged in two dimensions.

The image processor 420 performs image correction processing and various other types of image processing on the basis of digital image data (pixel data) from the sensor device 410.

The processor 430 controls the electronic instrument as a whole and controls each block within the electronic instrument. The processor 430 is realized by a CPU or the like, for example. The storage unit 440 stores various types of information and functions as a work area for the processor 430 or the image processor 420, for example. The operating unit 450 serves as an interface for operation of the electronic instrument by a user, and is realized by various buttons, a GUI (graphical user interface) screen, or the like, for example. The display unit 460 displays the image acquired by the sensor device 410, the GUI screen, and other images, for example, and is realized by a liquid crystal display, an organic EL display, or another type of display.

A pyroelectric detector of one cell may thus be used as an infrared sensor or other sensor, or the pyroelectric detector of one cell may be arranged along orthogonal axes in two dimensions to form the sensor device 410, in which case a heat (light) distribution image can be provided. This sensor device 410 can be used to form an electronic instrument for thermography, automobile navigation, a surveillance camera, or another application.

As shall be apparent, by using one cell or a plurality of cells of pyroelectric detectors as a sensor, it is possible to form an object analysis instrument (measurement instrument) for analyzing (measuring) physical information of an object, a security instrument for detecting fire or heat, an FA (factory automation) instrument provided in a factory or the like, and various other electronic instruments.

Figure 7A:
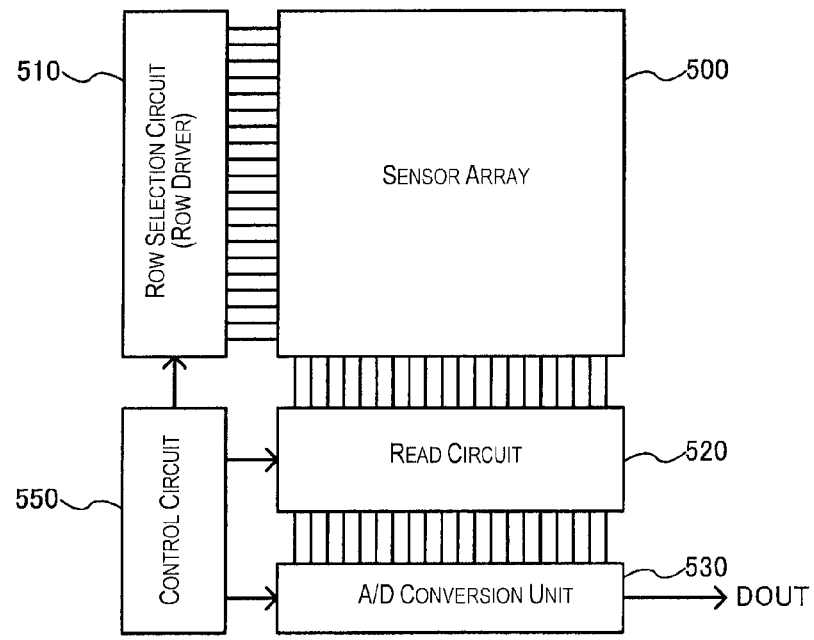
FIGS. 7A and 7B are views showing an example of the configuration of a pyroelectric detection device in which pyroelectric detectors are arranged in two dimensions.

FIG. 7A shows an example of the configuration of the sensor device 410 shown in FIG. 6. This sensor device includes a sensor array 500, a row selection circuit (row driver) 510, and a read circuit 520. An A/D conversion unit 530 and a control circuit 550 may also be included. An infrared camera or the like used in a night vision instrument or the like, for example, can be realized through the use of the sensor device described above.

A plurality of sensor cells is arrayed (arranged) along two axes as shown in FIG. 2, for example, in the sensor array 500. A plurality of row lines (word lines, scan lines) and a plurality of column lines (data lines) are also provided. The number of either the row lines or the column lines may be one. In a case in which there is one row line, for example, a plurality of sensor cells is arrayed in the direction (transverse direction) of the row line in FIG. 7A. In a case in which there is one column line, a plurality of sensor cells is arrayed in the direction (longitudinal direction) of the column line.

Figure 7B:
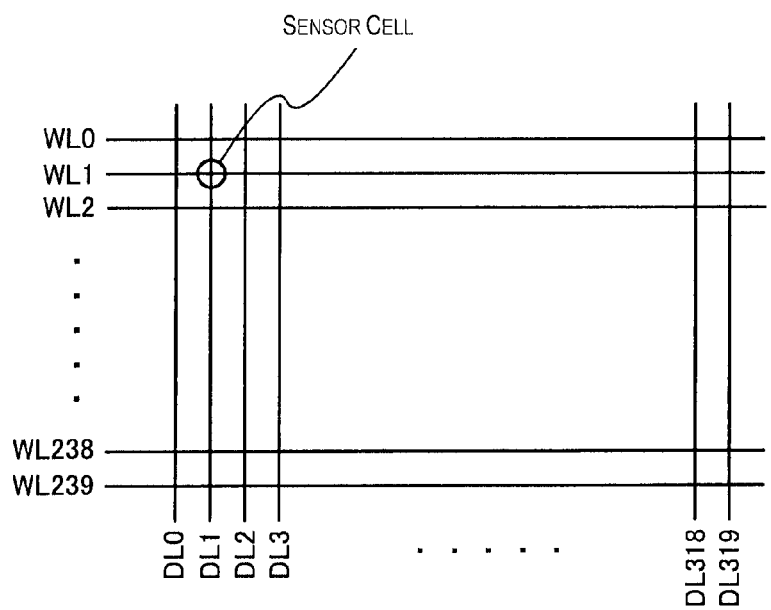

As shown in FIG. 7B, the sensor cells of the sensor array 500 are arranged (formed) in locations corresponding to the intersection positions of the row lines and the column lines. For example, a sensor cell in FIG. 7B is disposed at a location corresponding to the intersection position of word line WL1 and column line DL1. Other sensor cells are arranged in the same manner.

The row selection circuit 510 is connected to one or more row lines, and selects each row line. Using a QVGA (320×240 pixels) sensor array 500 (focal plane array) such as the one shown in FIG. 7B as an example, an operation is performed for sequentially selecting (scanning) the word lines WL0, WL1, WL2, . . . WL239. In other words, signals (word selection signals) for selecting these word lines are outputted to the sensor array 500.

The read circuit 520 is connected to one or more column lines, and reads each column line. Using the QVGA sensor array 500 as an example, an operation is performed for reading detection signals (detection currents, detection charges) from the column lines DL0, DL1, DL2, . . . DL319.

The A/D conversion unit 530 performs processing for A/D conversion of detection voltages (measurement voltages, attained voltages) acquired in the read circuit 520 into digital data. The A/D conversion unit 530 then outputs the A/D converted digital data DOUT. Specifically, the A/D conversion unit 530 is provided with A/D converters corresponding to each of the plurality of column lines. Each A/D converter performs A/D conversion processing of the detection voltage acquired by the read circuit 520 in the corresponding column line. A configuration may be adopted in which a single A/D converter is provided so as to correspond to a plurality of column lines, and the single A/D converter is used in time division for A/D conversion of the detection voltages of a plurality of column lines.

The control circuit 550 (timing generation circuit) generates various control signals and outputs the control signals to the row selection circuit 510, the read circuit 520, and the A/D conversion unit 530. A control signal for charging or discharging (reset), for example, is generated and outputted. Alternatively, a signal for controlling the timing of each circuit is generated and outputted.

Several embodiments are described above, but it will be readily apparent to those skilled in the art that numerous modifications can be made herein without substantively departing from the new matter and effects of the present invention. All such modifications are thus included in the scope of the present invention. For example, in the specification or drawings, terms which appear at least once together with different terms that are broader or equivalent in meaning may be replaced with the different terms in any part of the specification or drawings.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A pyroelectric detector comprising:
a support member including a first side and a second side opposite from the first side, with the first side facing a cavity;
a capacitor including a pyroelectric body between a first electrode and a second electrode such that an amount of polarization varies based on a temperature, the capacitor being mounted and supported on the second side of the support member with the first electrode being disposed on the second side of the support member; and
a fixing part supporting the support member, with the cavity being formed between the support member and the fixing part.

2. The pyroelectric detector according to claim 1, wherein the first electrode has a greater thickness than the second electrode.

3. The pyroelectric detector according to claim 2, wherein the first electrode, the second electrode, and the pyroelectric body are preferentially-oriented in a prescribed crystal plane,
the first electrode has a seed layer for preferentially-orienting the pyroelectric body in the prescribed crystal plane,
the second electrode has an orientation alignment layer in a position contacting the pyroelectric body with crystal orientation of the orientation alignment layer being aligned with crystal orientation of the pyroelectric body, and
the seed layer has a greater thickness than the orientation alignment layer.

4. The pyroelectric detector according to claim 3, wherein the first electrode further includes an orientation control layer for preferentially-orienting the seed layer in the prescribed crystal plane, the orientation control layer being disposed between the support member and the seed layer.

5. The pyroelectric detector according to claim 4, wherein the first electrode further includes a first reducing gas barrier layer having barrier properties with respect to a reducing gas, the first reducing gas barrier layer being disposed between the seed layer and the orientation control layer.

6. The pyroelectric detector according to claim 5, wherein the first electrode further includes an adhesive layer between the orientation control layer and the support member.

7. The pyroelectric detector according to claim 5, wherein the second electrode further includes a second reducing gas barrier layer having barrier properties with respect to a reducing gas, with the orientation alignment layer being disposed between the second reducing gas barrier layer and the pyroelectric body.

8. The pyroelectric detector according to claim 7, wherein the second electrode further includes a low-resistance layer, with the second reducing gas barrier layer being disposed between the low-resistance layer and the orientation control layer, and
the orientation control layer and the low-resistance layer are made of the same material, and the orientation control layer has a greater thickness than the low-resistance layer.

9. The pyroelectric detector according to claim 7, wherein the first reducing gas barrier layer and the second reducing gas barrier layer are made of the same material, and the first reducing gas barrier layer has a greater thickness than the second reducing gas barrier layer.

10. The pyroelectric detector according to claim 7, wherein the first reducing gas barrier layer and the second reducing gas barrier layer are made of the same material, and the second reducing gas barrier layer has a greater thickness than the first reducing gas barrier layer.

11. The pyroelectric detector according to claim 3, wherein the prescribed crystal plane is a (111) plane.

12. The pyroelectric detector according to claim 1, further comprising
a light-absorbing member configured to transmit heat obtained by absorption of light to the capacitor, the light-absorbing member being disposed on an upstream side of the capacitor with respect to an incidence path of light incident to the second electrode of the capacitor, and
the second electrode being configured to reflect the light passed through the light-absorbing member to the light-absorbing member.

13. The pyroelectric detector according to claim 1, further comprising
an open part communicated with the cavity.

14. A pyroelectric detection device comprising:
a plurality of the pyroelectric detectors according to claim 1 arranged in two dimensions along two axes.

15. A pyroelectric detection device comprising:
a plurality of the pyroelectric detectors according to claim 2 arranged in two dimensions along two axes.

16. A pyroelectric detection device comprising:
a plurality of the pyroelectric detectors according to claim 3 arranged in two dimensions along two axes.

17. A pyroelectric detection device comprising:
a plurality of the pyroelectric detectors according to claim 4 arranged in two dimensions along two axes.

18. A pyroelectric detection device comprising:
a plurality of the pyroelectric detectors according to claim 5 arranged in two dimensions along two axes.

19. An electronic instrument comprising:
the pyroelectric detector according to claim 1.

20. An electronic instrument comprising:
the pyroelectric detection device according to claim 14.

* * * * *